(12) United States Patent
Fukui et al.

(10) Patent No.: US 6,352,879 B1
(45) Date of Patent: Mar. 5, 2002

(54) SEMICONDUCTOR DEVICE AND METHOD OF MANUFACTURING THE SAME

(75) Inventors: Yasuki Fukui, Tenri; Yoshiki Sota, Nara; Yuji Matsune, Tenri; Atsuya Narai, Yamatokoriyama, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/604,081

(22) Filed: Jun. 27, 2000

Related U.S. Application Data

(62) Division of application No. 09/223,272, filed on Dec. 30, 1998, now Pat. No. 6,100,594.

(30) Foreign Application Priority Data

Jan. 14, 1998 (JP) ................................................ 10-5221

(51) Int. Cl.[7] .......................... H01L 21/44; H01L 21/48; H01L 21/50
(52) U.S. Cl. ....................... 438/106; 438/107; 438/109; 438/118; 438/127
(58) Field of Search .......................... 438/110, 107–109, 438/114, 118, 124, 458, 106; 257/777, 738, 778

(56) References Cited

U.S. PATENT DOCUMENTS

| | | | | |
|---|---|---|---|---|
| 5,366,933 A | * | 11/1994 | Golwalkar et al. | 438/107 |
| 5,422,435 A | * | 6/1995 | Takiar et al. | 174/52.4 |
| 5,527,740 A | * | 6/1996 | Golwalkar et al. | 438/107 |
| 5,766,986 A | * | 6/1998 | Weber et al. | 438/124 |
| 5,898,220 A | * | 4/1999 | Ball | 257/723 |
| 5,930,599 A | * | 7/1999 | Fujimoto et al. | 438/113 |
| 6,093,584 A | * | 7/2000 | Fjelstad | 438/127 |
| 6,130,483 A | * | 10/2000 | Shizuki et al. | 257/778 |
| 6,133,067 A | * | 10/2000 | Jeng et al. | 438/110 |
| 6,133,637 A | * | 10/2000 | Hikita et al. | 257/777 |
| 6,157,080 A | * | 12/2000 | Tamaki et al. | 257/738 |

FOREIGN PATENT DOCUMENTS

| | | |
|---|---|---|
| JP | 5-90486 A | 4/1993 |
| JP | 9-121002 A | 5/1997 |

\* cited by examiner

Primary Examiner—Matthew Smith
Assistant Examiner—Chuong A Luu
(74) Attorney, Agent, or Firm—Nixon & Vanderhye P.C.

(57) ABSTRACT

A first semiconductor chip is produced by affixing a thermocompression sheet to the back surface of a wafer having a circuit formed on its front surface. The first semiconductor chip is mounted on a circuit board including an insulating substrate and a wiring layer provided on the insulating substrate so that the back surface of the first semiconductor chip faces the circuit board. A second semiconductor chip produced in the same manner as the first semiconductor chip is mounted on the first semiconductor chip with its back surface facing the first semiconductor chip. Each of the first and second semiconductor chips is wire-bonded to the wiring layer with a wire. The first and second semiconductor chips and the wire are sealed with a sealing resin. The wiring layer is connected to external connection terminals through via holes provided in the insulating substrate.

15 Claims, 15 Drawing Sheets

SEMICONDUCTOR DEVICE AND METHOD OF MANUFACTURING THE SAME

This is a divisional of application Ser. No. 09/223,272, filed Dec. 30, 1998, the entire content of which is hereby incorporated by reference in this application now U.S. Pat. No. 6,100,594.

FIELD OF THE INVENTION

The present invention relates to a semiconductor device and a method of manufacturing the same, and more particularly relates to a semiconductor device having a structure substantially miniaturized to a chip size, i.e., a CSP (Chip Size Package) structure, and a method of manufacturing such a semiconductor device.

BACKGROUND OF THE INVENTION

Miniaturization of a semiconductor device is in progress so as to achieve a high-density semiconductor device for use on a printed circuit board. Recently, a semiconductor device substantially miniaturized to a chip size has been developed. The structure of such a miniaturized semiconductor device is called a CSP structure. Japanese Publication of Unexamined Patent Application No. 121002/1997 (Tokukaihei 9-121002) discloses a semiconductor device having the CSP structure shown in FIG. 13(*a*). This semiconductor device includes a semiconductor chip 42 disposed with its circuit formed surface facing up, and wires 43 for electrically connecting the semiconductor chip 42 to a wiring pattern 47. The above publication discloses another semiconductor device having the CSP structure shown in FIG. 13(*b*). This semiconductor device includes a semiconductor chip 64 disposed with its circuit formed surface facing down, and a bump electrode 70 for electrically connecting the semiconductor chip 64 to a wiring pattern 66.

In FIG. 13(*a*), 41 is a wiring component, 42 is a semiconductor chip, 43 is a wire, 44 is a resin sealing member, 45 is a throughhole, 46 is a substrate, 47 is a wiring pattern, 48 is an insulating material, 49 is an external connection-use terminal, 50 is an external connection area, 51 is an electrode, 52 is a window opening section, and 53 is an inner connection area. In FIG. 13(*b*), 61 is a throughhole, 62 is a wiring component, 63 is an electrode, 64 is a semiconductor chip, 65 is a resin sealing member, 66 is a wiring pattern, 67 is an inner connection area, 68 is an external connection area, 69 is an external connection-use terminal, and 70 is a bump electrode.

In some devices such as portable devices, a plurality of semiconductor chips are mounted in a package so as to increase the added value and capacity of memory, etc. For example, a multi-chip module is provided with a plurality of semiconductor chips arranged parallel to each other in a package. However, such an arrangement makes it impossible to produce a package smaller than the total area of the semiconductor chips to be mounted. In order to solve the problem, a stacked package including a plurality of semiconductor chips laminated in a package to achieve a high packaging density is disclosed in Japanese Publication of Unexamined Patent Application No. 90486/1993 (Tokukaihei 5-90486).

Specifically, the semiconductor devices disclosed in the above publication are each packaged in ceramic packages and arranged in the following manner. In one of the semiconductor devices, a pair of semiconductor chips are adhered to each other with their back surfaces where a circuit is not formed facing each other, and are mounted on another pair of semiconductor chips via metal bumps. In the other semiconductor device, a pair of semiconductor chips are adhered to each other with the circuit formed surface of one semiconductor chip facing the back surface of the other semiconductor chip.

The above-mentioned stacked package is a small, high-density semiconductor device. However, a semiconductor device smaller than such a stacked package has been required. For that reason, a semiconductor device having a CSP structure as well as a stacked package structure is required to be produced.

In a semiconductor device having a CSP structure where the semiconductor chips are laminated, an adhesive agent (paste) potting method and a method using a thermo-compression sheet are utilized for bonding the semiconductor chip to the substrate, and for bonding the laminated semiconductor chips to each other.

In the potting method, if the amount of the adhesive agent is excessive, a large amount of adhesive agent spreads beyond the outer edge of the semiconductor chip. For example, as shown in FIG. 14(*a*), when bonding semiconductor chips 81 and 82 to each other with their back surfaces facing each other, an adhesive agent 87 between the semiconductor chips 81 and 82 overflows. In addition, as shown in FIG. 15, in the step of wire-bonding the semiconductor chip 82 disposed on the top to an electrode section of a wiring layer 84 (before a sealing resin 89 and packaging-use external terminals 90 are formed), wiring on an insulating substrate 83 must be provided far from the side surfaces of the semiconductor chips 81 and 82 so as to keep the overflown adhesive agent 87*a* from coming into contact with a jig 92 of a wire bonder. Such an arrangement causes the package size to be increased in the end. Furthermore, as shown in FIG. 14(*b*), when bonding the back surface of the semiconductor chip 82 to the circuit formed surface of the semiconductor chip 81, the overflown adhesive agent 87*a* may stick to an electrode pad provided on the semiconductor chip 81.

On the other hand, if the amount of the adhesive agent is too small, a gap is produced between the semiconductor chips 81 and 82. This gap cannot be filled with the sealing resin 89, thereby causing problems such as separation of the semiconductor chip 82 from the semiconductor chip 81.

The method using a thermo-compression sheet requires the steps of placing members at the right locations. Specifically, a thermo-compression sheet having the same size as the semiconductor chip 82 must be placed accurately at a specific location an the semiconductor chip 81. In addition, the semiconductor chip 82 must be bonded to the thermo-compression sheet so as to be located exactly on the top of the thermo-compression sheet.

In FIGS. 14(*a*) and 14(*b*), 85 is an insulating sheet, 86 is a metal bump, and 91 is an adhesive sheet.

SUMMARY OF THE INVENTION

An object of the present invention is to provide a further-miniaturized semiconductor device having a stacked package structure as well as a CSP structure.

In order to achieve the above object, a semiconductor device in accordance with the present invention has a stacked package structure and a chip size package structure and is characterized in including:

an insulating substrate including a wiring layer having electrode sections;

a first semiconductor chip having a first insulating adhesion layer adhered to its back surface where a circuit is not formed, the first semiconductor chip being mounted on the wiring layer through the first insulating adhesion layer; and a second semiconductor chip having a second insulating adhesion layer adhered to its back surface where a circuit is not formed, the second semiconductor chip being mounted on a circuit-formed front surface of the first semiconductor chip through the second insulating adhesion layer;

each of the first and second semiconductor chips being wire-bonded to the electrode section with a wire, the first and second semiconductor chips and the wire being sealed with a resin.

In the above structure, the first semiconductor chip and the second semiconductor chip are each wire-bonded to the electrode section provided on the wiring layer with the wires, and the second insulating adhesion layer is used for affixing the second semiconductor chip to the first semiconductor chip. This structure eliminates the need for wire-bonding the first and second semiconductor chips to points on the wiring layer, far from the side surfaces of the first and second semiconductor chips, considering a situation in which the excessively applied adhesive agent overflows the space between the first and second semiconductor chips. Therefore, a miniaturized, high-density semiconductor device can be realized.

Furthermore, in the case of using a thermo-compression sheet, when mounting the first or second semiconductor chip at a desired location, accurate positioning is required twice, i.e., positioning the thermo-compression sheet, etc., and positioning the first or second semiconductor chip on the thermo-compression sheet. In contrast, the first and second insulating adhesion layers according to the present invention are in advance disposed on the back surfaces of the first and second semiconductor chips, respectively. Therefore, the first or second semiconductor chip can be mounted at a desired location by accurately positioning it once. It is thus possible to miniaturize the semiconductor device without complicating its manufacturing process.

A semiconductor device in accordance with the present invention can be arranged to include:

an insulating substrate including a wiring layer having electrode sections;

a first semiconductor chip having a circuit formed on its front surface and an insulating adhesion layer adhered to its back surface;

a metal bump, disposed between the first semiconductor chip and the wiring layer, for bump-bonding the front surface of the first semiconductor chip to the wiring layer so that the front surface faces the wiring layer; and a second semiconductor chip whose back surface where a circuit is not formed is mounted on the back surface of the first semiconductor chip through the insulating adhesion layer;

the second semiconductor chip being wire-bonded to the electrode section of the wiring layer with a wire, the first and second semiconductor chips and the wire being sealed with a resin.

In the above arrangement, the first semiconductor chip is connected to the wiring layer through the metal bump, the second semiconductor chip is wire-bonded to the electrode sections on the wiring layer with wires, and the back surfaces of the first and second semiconductor chips are adhered to each other by the insulating layer. This arrangement eliminates the need for wire-bonding the second semiconductor chip to points on the wiring layer, far from the side surfaces of the first and second semiconductor chips, considering a situation in which the excessively applied adhesive agent overflows the space between the first and second semiconductor chips. Therefore, a miniaturized, high-density semiconductor device can be realized.

In the case of using the thermo-compression sheet, when mounting the second semiconductor chip on the first semiconductor chip, accurate positioning is required twice in a conventional manufacturing method, i.e., positioning the thermo-compression sheet on the first semiconductor chip, and positioning the second semiconductor chip on the thermo-compression sheet. However, the insulating adhesion layer according to the present invention are disposed on the back surface of the second semiconductor chip in advance. Therefore, the second semiconductor chip can be mounted at a desired location on the first semiconductor chip by accurately positioning it once. It is thus possible to miniaturize the semiconductor chip without complicating its manufacturing process.

A method of manufacturing a semiconductor device in accordance with the present invention includes the steps of:

(a) forming a first insulating adhesion layer on a back surface of a first wafer having a circuit formed on its front surface;

(b) producing separate first semiconductor chips from the first wafer by dicing;

(c) mounting the first semiconductor chip on a wiring layer with its back surface facing the wiring layer;

(d) forming a second insulating adhesion layer on a back surface of a second wafer having a circuit formed on its front surface;

(e) producing separate second semiconductor chips from the second wafer by dicing;

(f) mounting the second semiconductor chip on the first semiconductor chip with its back surface facing the first semiconductor chip;

(g) wire-bonding the first semiconductor chip to an electrode section of the wiring layer with a wire;

(h) wire-bonding the second semiconductor chip to an electrode section of the wiring layer with a wire; and (i) sealing the first and semiconductor chips and the wires.

With the above manufacturing method, since the first or second semiconductor chip has the first or second insulating adhesion layer adhered to its back surface in advance when being in the wafer state, the first or second semiconductor chip can be mounted at a desired location without the step of accurately positioning the first or second insulating adhesion layer on the first or second semiconductor chip. It is thus possible to simplify the process of manufacturing the semiconductor chip.

Morever, in the above manufacturing method, the adhesive agent does not overflow the space between the first and second semiconductor chips, the first and second semiconductor chips can be wire-bonded to the wiring layer at a location closer to the edges of the first and second semiconductor chips. It is thus possible to realize a miniaturized, high-density semiconductor device.

A method of manufacturing a semiconductor device in accordance with the present invention including the steps of:

(a) forming an insulating layer and a metal bump on a wiring layer;

(b) mounting a first semiconductor chip on the wiring layer with its circuit-formed surface facing the wiring layer;

(c) forming an insulating adhesion layer on a back surface of a wafer having a circuit formed on its front surface;

(d) producing separate second semiconductor chips from the wafer by dicing;

(e) mounting the second semiconductor chip on the first semiconductor chip with its back surface facing the first semiconductor chip;

(f) wire-bonding the second semiconductor chip to the wiring layer with a wire; and (g) sealing the first and second semiconductor chips and the wire.

In this manufacturing method, like the above-mentioned method of the present invention, since the second semiconductor chip has the insulating adhesion layer adhered to its back surface in advance when being in the wafer state, the second semiconductor chip can be mounted at a desired location without the step of accurately positioning the insulating adhesion layer on the second semiconductor chip. It is thus possible to simplify the process of manufacturing the semiconductor chip.

Furthermore, in the above manufacturing method, the adhesive agent does not overflow the space between the first and second semiconductor chips, the second semiconductor chip can be wire-bonded to the wiring layer at a location closer to the edges of the first and second semiconductor chips. It is thus possible to realize a miniaturized, high-density semiconductor device.

For a fuller understanding of the nature and advantages of the invention, reference should be made to the ensuing detailed description taken in conjunction with the accompanying drawings.

DESCRIPTION OF THE PREFERRED EMBODIMENTS

Embodiment 1

The following descriptions will explain one embodiment of the present invention with reference to FIGS. 1 to 9.

Figure 1:
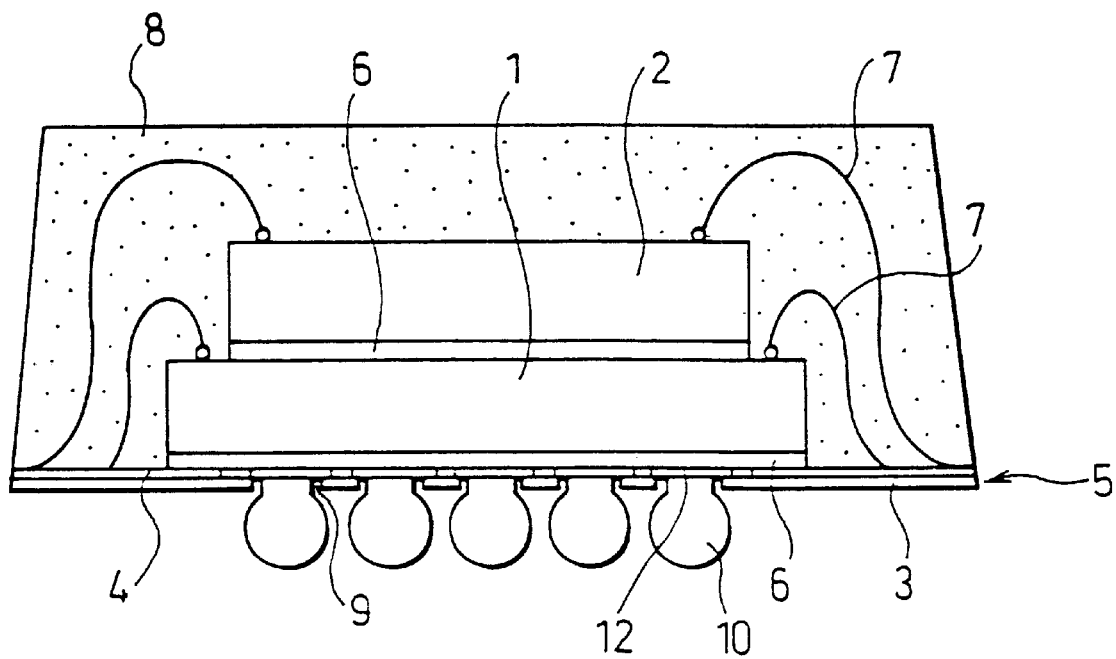
FIG. 1 is a cross-sectional view of a semiconductor device in accordance with the first embodiment of the present invention.

As shown in FIG. 1, in a semiconductor device according to this embodiment, a first semiconductor chip 1 and a second semiconductor chip 2 are laminated in this order on a circuit board 5 including an insulating substrate 3 and a wiring layer 4 mounted on the insulating substrate 3. Regarding the first semiconductor chip 1 and the second semiconductor chip 2, the surface (front surface) on which an element is formed is hereinafter referred to as a "circuit formed surface", and the surface opposite thereto is referred to as a "back surface".

The semiconductor chip 1 is disposed with its back surface facing the insulating substrate 3. The second semiconductor chip 2 is mounted on the circuit formed surface of the first semiconductor chip 1 through a thermo-compression sheet (adhesion layer) 6 so that its back surface is adhered to the thermo-compression sheet 6.

The semiconductor device in accordance with the present embodiment is arranged so that the second semiconductor chip 2 is mounted on the circuit formed surface of the first semiconductor chip 1. With this arrangement, the second semiconductor chip 2 on the top of the first semiconductor chip 1 does not influence (interfere with) electrode pads of the first semiconductor chip 1. The circuit formed surface of the first semiconductor chip 1 is in advance coated with an insulating-resin, etc. Namely, the coating is applied to the circuit formed surface of the first semiconductor chip 1 by a spin coating method, etc. when the first semiconductor chip 1 is in a wafer state before subjected to dicing. In this case, the coating material on the electrode pads (not shown) disposed on the circuit formed surface of the first semiconductor chip 1 is removed.

The first semiconductor chip 1 and the second semiconductor chip 2 are each connected (wire-bonded) to electrode sections of the wiring layer 4 on the insulating substrate 3 with wires 7.

The first semiconductor chip 1, the second semiconductor chip 2 and the wires 7, arranged as above, are covered by a sealing resin 8.

The insulating substrate 3 includes via holes 9 at the locations corresponding to below-described land sections 12 constituting the wiring layer 4. Ball-like packaging-use external terminals 10 are connected in an area-array-like arrangement to the land sections 12 through the via holes 9 from the side of the insulating substrate 3, on which side the first semiconductor chip 1 and the second semiconductor chip 2 are not formed.

Next, the following descriptions will explain in further detail the above-mentioned members constituting the semiconductor device in accordance with the present embodiment.

Figure 2A:
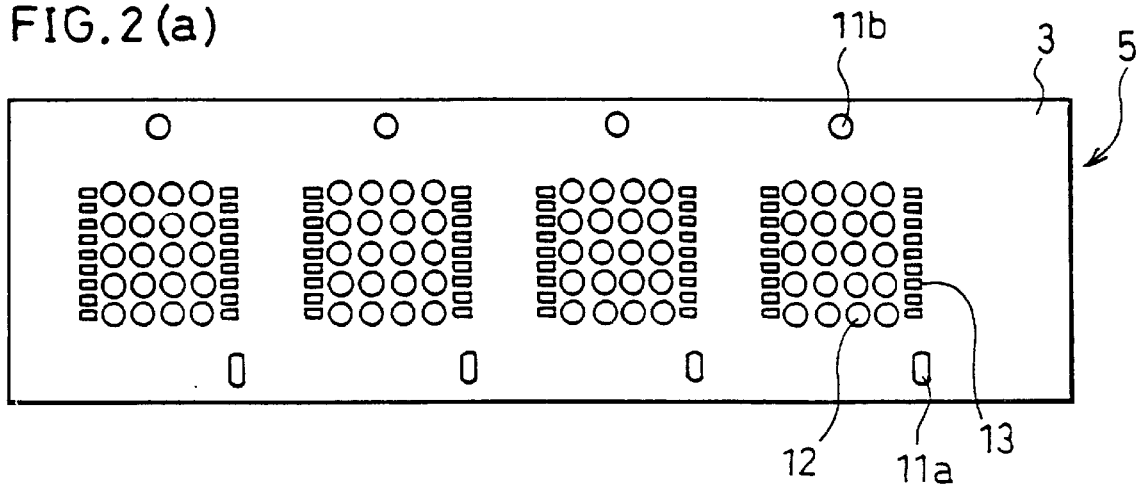
FIG. 2(a) is a plan view of a circuit board before being cut.

FIG. 2(a) is a plan view of the circuit board 5 before being cut in the process of manufacturing the semiconductor device. As shown in FIG. 2(a) four guide holes 11 are formed in both side sections of the insulating substrate 3 (the upper part and the lower part of the insulating substrate 3 in FIG. 2(a)) of the circuit board 5 before being cut. The guide holes 11a formed in one of the side section and the guide holes 11b formed in the other side section have different shapes. These guide holes 11 are used for transporting the semiconductor device during its manufacturing process.

The material of the insulating substrate 3 is not particularly limited, and a resin substrate or a film having excellent heat resistance is acceptable. The insulating material 3 may be a resin substrate, etc. made of, for example, polyimide, epoxy resin containing glass fiber, bismaleid triazine (BT) resin, polyester, polyamide, fluororesin, ceramic, and polyester containing glass fiber. Polyimide is the most preferable of the above materials.

Figure 2B:
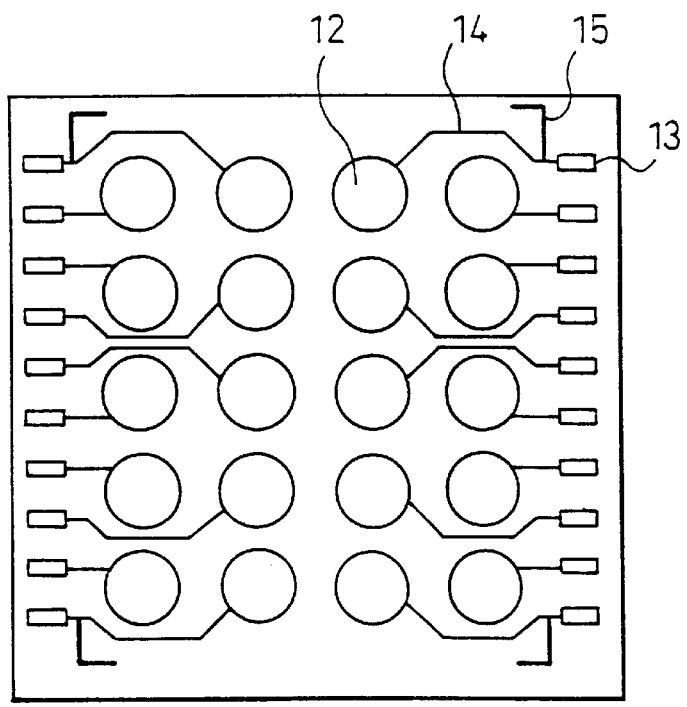
FIG. 2(b) is a partially enlarged view of the circuit board shown in FIG. 2(a).

FIG. 2(b) is a partially enlarged view of the circuit board 5 shown in FIG. 2(a), showing the structure of the wiring layer 4. As shown in FIG. 2(b), the wiring layer 4 includes the land sections 12, electrode sections 13, and wiring sections 14, disposed on the insulating substrate 3. Each of the. wiring sections 14 connects the land section 12 to the electrode section 13.

The electrode sections 13 are formed on both ends of the wiring layer 4 (the left part and the right part of the wiring layer 4 in FIG. 2(b)). As explained in detail later, each of the electrode section 13 is connected to the first semiconductor chip 1 or the second semiconductor chip 2 by the wire 7. Therefore, the electrode sections 13 are located outside the area of the wiring layer 4, where the first semiconductor chip 1 and the second semiconductor chip 2 are mounted.

The land section 12 is a packaging-use external terminal forming section for connecting the packaging-use external terminal 10 and the wiring layer 4 through the via hole 9 of the insulating substrate 3.

The first semiconductor chip 1 can be completely insulated from the wiring layer 4 by, for example, providing a sheet of an insulating resin on an area of the wiring layer 4 where the first semiconductor chip 1 is to be mounted or applying an insulating resin coating to the area of the wiring layer 4. The wiring layer 4 is made of copper (Cu), aluminum (Al), gold (Au), nickel (Ni), and other materials. Cu is particularly preferable because it is less costly. Methods of forming the wiring layer 4 on the insulating substrate 3 include a vapor deposition method and a plating method. In order to pattern the wiring layer 4 to form a desired pattern, a conventional photolithography method can be utilized.

Figure 3A:
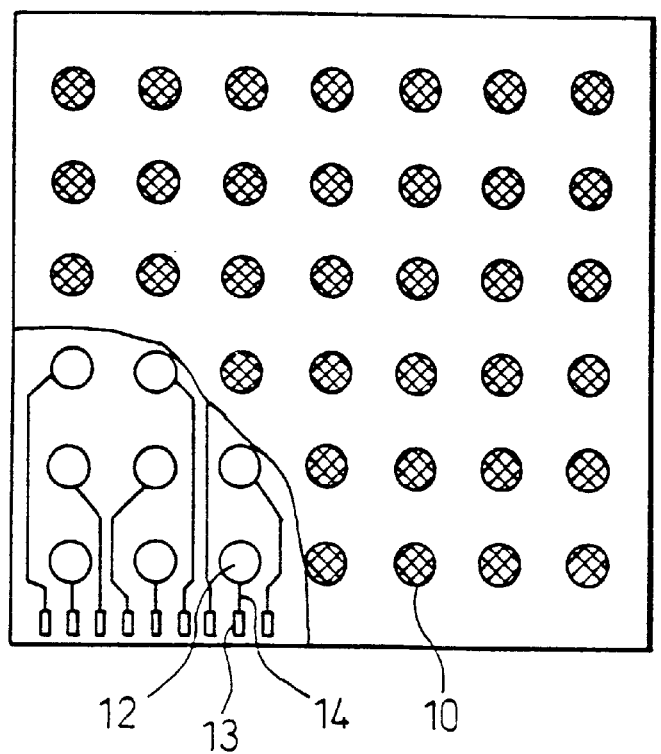
FIG. 3(a) is an explanatory view showing an arrangement of ball-like external connection-use terminals.
Figure 3B:
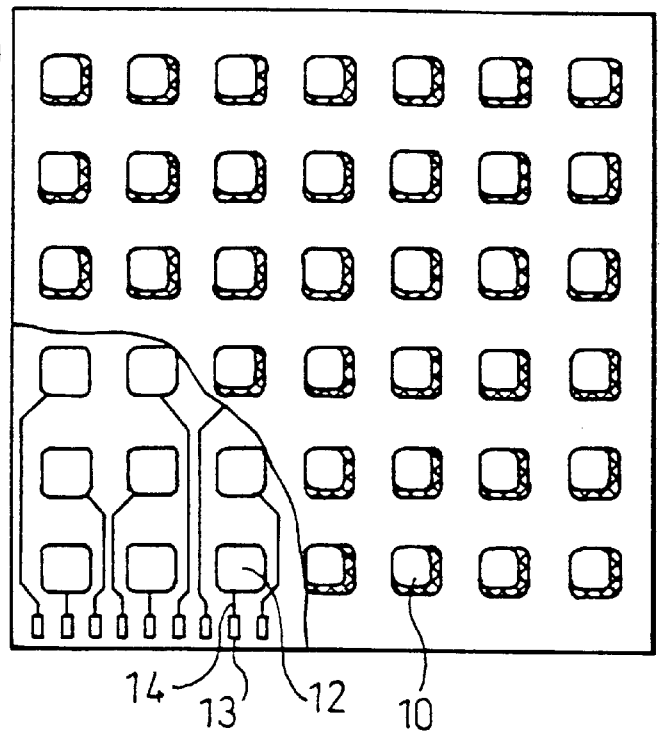
FIG. 3(b) is an explanatory view showing an arrangement of trapezoidal external connection-use terminals.

FIG. 3(a) is a view seen from the back side of the semiconductor device shown in FIG. 1, i.e., the side where the packaging-use external terminals 10 are disposed. As shown in FIG. 3(a), ball-like packaging-use external terminals 10 are disposed in an area-array-like arrangement, and connected to the land sections 12 provided on the wiring layer 4. The packaging-use external terminals 10 are not limited to a ball-like shape, and may have a trapezoidal shape as shown in FIG. 3(b).

Each of the wires 7 is used for connecting the electrode pad disposed on the first semiconductor chip 1 or the second semiconductor chip 2 to the electrode section 13 of the wiring layer 4. In a conventional semiconductor device, a gold ball provided on only one end of the wire is in contact with the electrode pad of the first semiconductor chip or the second semiconductor chip, and the other end of the wire is connected to the electrode section of the wiring layer on the insulating substrate. Here, the gold ball can be provided on only one end of the wire. The gold ball is brought into contact with the electrode pad by imposing a load lighter than the load applied in connecting, by thermo-compression bonding, the wire to the electrode section of the wiring layer on the insulating substrate. This is because connecting the wires to the semiconductor chips by thermo-compression bonding, i.e., by application of a heavy load, increases the possibility of damaging the semiconductor chips.

However, the above conventional arrangement has the following problem. Namely, the wires, especially those connected to the second semiconductor chip, are connected to the electrode sections of the wiring layer provided on the circuit board at a small angle with respect to the circuit board. Therefore, the wire is connected to the circuit board, far from the end of the first semiconductor chip.

Figure 4:
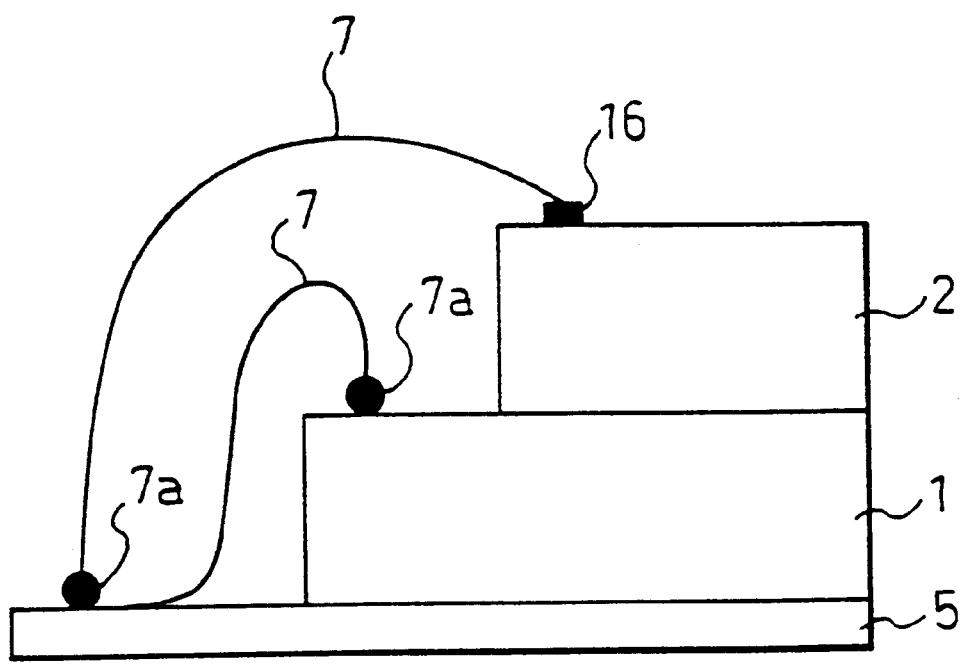
FIG. 4 is an explanatory view showing how laminated semiconductor chips are each wire-bonded to the circuit board.

In order to solve the problem, in the semiconductor device according to the present embodiment, the first semiconductor chip 1 and the second semiconductor chip 2 are each wire-bonded to the circuit board 5 as shown in FIG. 4. The first semiconductor chip 1 and the circuit board 5 are wire-bonded in the same manner as the conventional semiconductor device. Then, the wire 7 is connected to the circuit board 5 with a gold ball 7a provided on one end of the wire 7. Thereafter, the other end of the wire 7 is connected, by thermo-compression bonding, to a gold bump 16 formed on the electrode pad of the second semiconductor chip 2 in advance so as to connect the second semiconductor chip 2 to the circuit board 5.

Since wire-bonding between the second semiconductor chip 2 and the circuit board 5 is performed as above, the wire 7 connected to the second semiconductor chip 2 is connected to the circuit board 5 at an angle closer to 90° with respect to the circuit board 5. Therefore , the wire 7 is connected to the circuit board 5 at a closer location to the end of the first semiconductor chip 1, thereby enabling further miniaturization of the semiconductor device in accordance with the present embodiment.

The wire 7 is connected to the gold bump 16 by thermo-compression bonding by a load nearly equal to the load applied when connecting the wire 7 to the electrode section of the wiring layer 4 on the insulating substrate 3 by thermo-compression bonding. However, by using the gold bump 16, the stress applied to the second semiconductor chip 2 can be lowered. It is thus possible to reduce the possibility that the second semiconductor chip 2 is damaged by a heavy load applied there to.

The gold bump 16 is formed by connecting a gold ball, provided on the end of the wire by the conventional method, to the electrode pad on the second semiconductor chip 2, and then cutting the wire 7. Thereafter, by making the upper surface of the gold bump 16 flat with a stamping jig, the wire 7 can be surely affixed to the gold bump 16 by thermo-compression bonding.

Note that the first semiconductor chip 1 and the circuit board 5 can be wire-bonded to each other in the same manner as the above-mentioned wire-bonding of the second semiconductor chip 2 and the circuit board 5.

The following descriptions will explain one example of the process (including steps (1) to (5)) for manufacturing the semiconductor device in accordance with the present embodiment with reference to FIGS. 5(a) to 5(g).

Figure 5A:
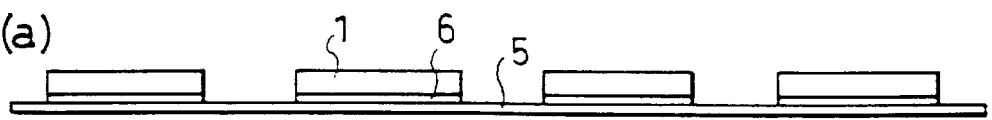
FIGS. 5(a) to 5(g) show one example of a process for manufacturing the semiconductor device.

(1) First, the first semiconductor chip 1 is mounted on the circuit board 5 (see FIG. 5(a)) When the first semiconductor chip 1 is in a wafer state, the insulating thermo-compression sheet 6 is adhered to the back surface of the wafer. Then, the wafer is cut to produce separate pieces of first semiconductor chips 1. The first semiconductor chip 1 is mounted on the circuit board 5 at a location inside a mount location recognition-use mark 15 provided on the circuit board 5. Here, instead of providing the thermo-compression sheet 6 in advance when the first semiconductor chip 1 is in the wafer state, an insulating paste made of epoxy resins, etc. may be applied onto the circuit board 5 before the first semiconductor chip 1 is mounted on the circuit board 5.

Figure 5B:
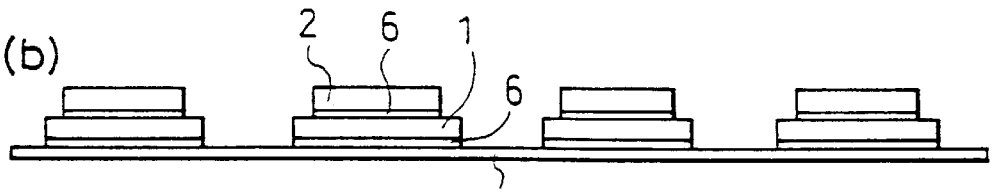
Figure 5C:
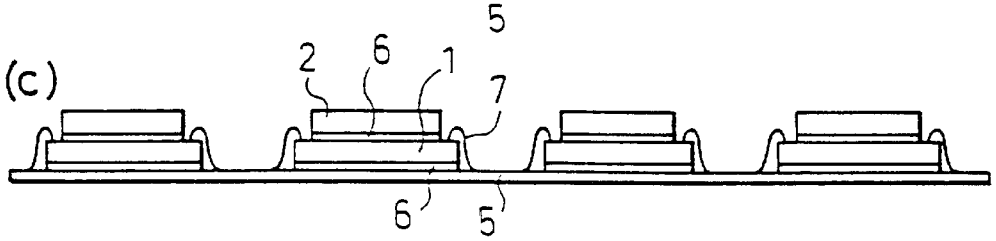

(2) Next, the second semiconductor chip 2 is mounted on the circuit formed surface of the first semiconductor chip 1 (see FIG. 5(b)). When the second semiconductor chip 2 is in the wafer state, the insulating thermo-compression sheet 6 is adhered to the back surface of the wafer, and then the wafer is cut to produce separate pieces of second semiconductor chips 2. The second semiconductor chip 2 is accurately positioned at a specific location on the circuit formed surface of the first semiconductor chip 1.

By affixing the thermo-compression sheet 6 to the back surface of the second semiconductor chip 2 in advance, accurate positioning is necessary only when mounting the second semiconductor chip 2 on the first semiconductor chip 1. Therefore, since one step requiring accurate positioning is omitted in the process for manufacturing the semiconductor device in accordance with the present embodiment, this manufacturing process is simplified compared with the conventional process in which the thermo-compression sheet 6 is disposed on the circuit formed surface of the first semiconductor chip 1, and then the second semiconductor chip 2 is adhered to the thermo-compression sheet 6.

(3) Then, each of the electrode pads (not shown) disposed on the first semiconductor chip 1 and the second semiconductor chip 2 is connected, with the wire 7 made of Au, to the electrode section 13 formed in the wiring layer 4 on the circuit board 5. More specifically, the first semiconductor chip 1 and the wiring layer 4 are first electrically connected to each other (see FIG. 5(c)), and then the second semiconductor chip 2 and the wiring layer 4 are electrically connected to each other (see FIG. 5(d)). Since the first semiconductor chip 1 and the second semiconductor chip 2 are each electrically connected to the wiring layer 4 in the above order, it is possible to avoid such a problem that the wire 7 for connecting the first semiconductor chip 1 to the circuit board 5 and the wire 7 for connecting the second semiconductor chip 2 to the circuit board 5 cross each other, and prevent connection of the firs t semiconductor chip 1 to the circuit board 5.

Figure 5D:
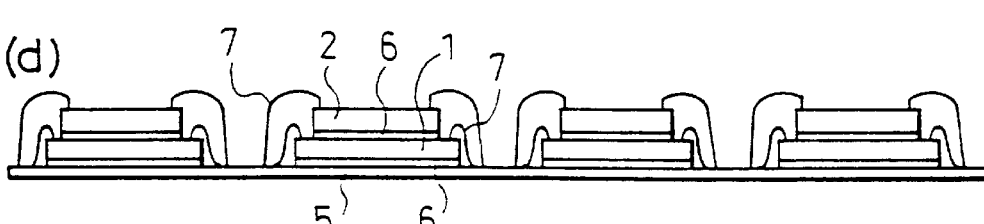
Figure 5E:
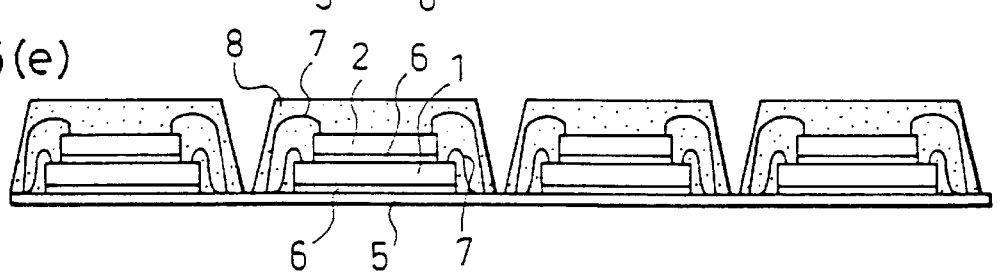
Figure 5F:
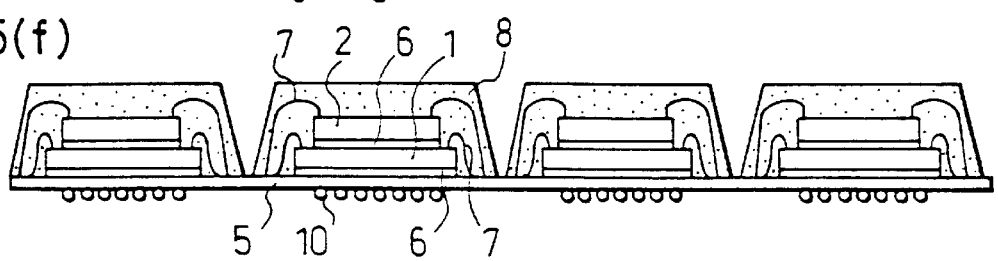
Figure 5G:
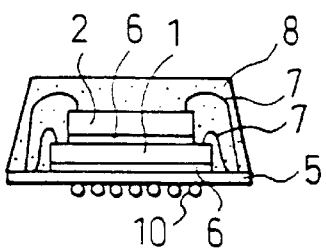

(4) Thereafter, each of the packaging-use external terminals 10 is disposed on the location where the via hole 9 is provided on the insulating substrate 3 on the circuit board 5 (see FIG. 5(f)). Here, positioning the packaging-use external terminal 10 is performed in such a manner that a solder ball is temporarily fixed to each via hole 9, heated in a reflow furnace, and then joined to the land section 12. Methods of temporarily fixing the solder ball to the via hole 9 include a method in which the solder ball is affixed to the via hole 9 after applying a flux to the via hole 9, and a method in which the solder ball is affixed to the via hole 9 after adhering the flux to the solder ball.

(5) Finally, a plurality of semiconductor devices produced on the circuit board 5 are divided into pieces of semiconductor devices (see FIG. 5(d)) by cutting the insulating substrate 3 along its unnecessary part, i.e., along the outer edge of the sealing resin 8 of each semiconductor device. Methods of cutting the insulating substrate 3 include a punching method using die, and an eximer laser cutting method.

Figure 6A:
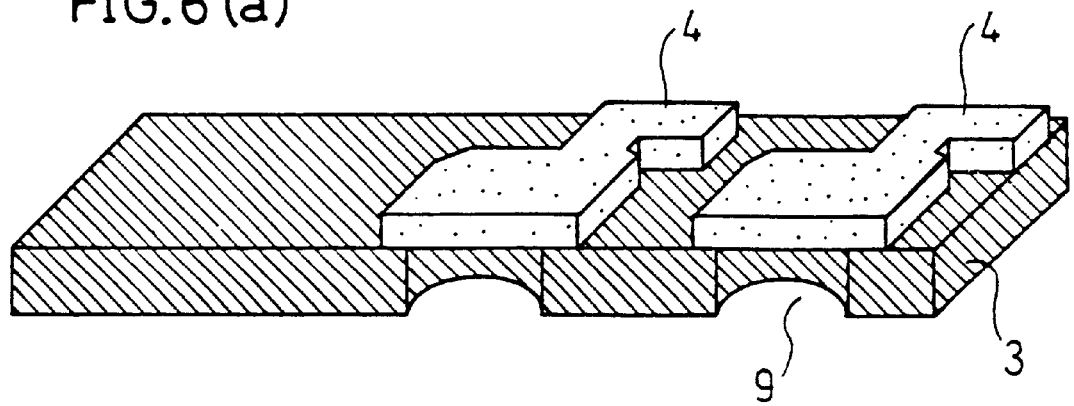
FIG. 6(a) is a partially enlarged view of the circuit board including a wiring layer disposed on one surface of an insulating substrate.

As shown in FIG. 6(a), the semiconductor device in accordance with the present embodiment includes the wiring layer 4 on only one of the surfaces of the insulating substrate 3. However, the wiring layer 4 can be provided on both surfaces of the insulating substrate 3 as shown in FIG. 6(b).

Figure 6B:
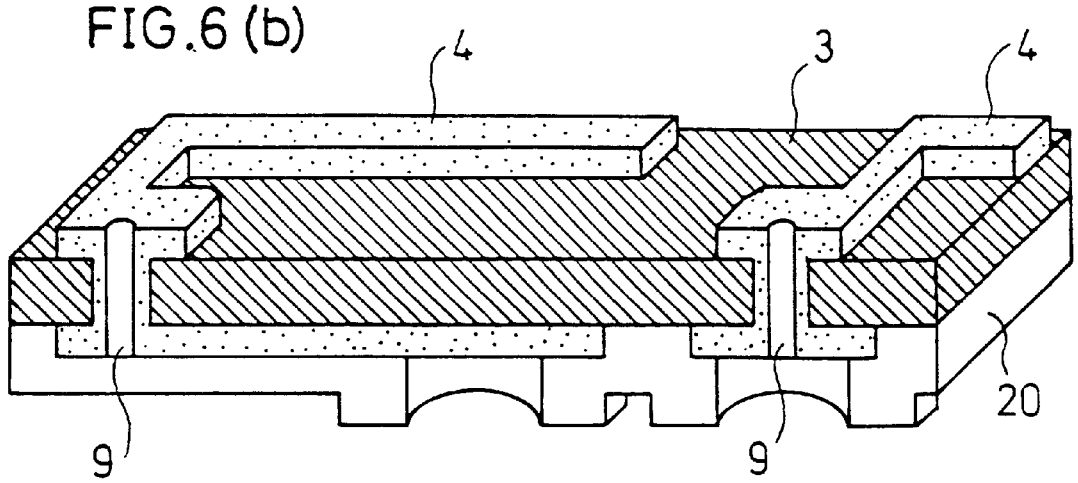
FIG. 6(b) is a partially enlarged view of a circuit board including a wiring layer disposed on each surface of the insulating substrate.

When the wiring layer 4 is formed on both surfaces of the insulating substrate 3, as shown in FIG. 6(b) the wiring layers 4 on the respective surfaces are electrically connected to each other through the plated via holes 9 as shown in FIG. 6(b) Regarding the wiring layer 4 on the side of the insulating substrate 3, the side where the first semiconductor chip 1 is not mounted, the area where the packaging-use external terminals 10 are not to be formed are covered with a solder resist 20, etc. In the area which is not covered with the solder resist 20, i.e., the area where the packaging-use external terminals 10 are to be provided, the packaging-use external terminals 10 are arranged in an area-array-like pattern.

When connecting the first semiconductor chip 1 and the second semiconductor chip 2 to the electrode sections 13 of the wiring layer 4 with the wires 7, if the wires 7 become too close to each other because of the layout of the electrode pads of the first semiconductor chip 1 and the second semiconductor chip 2, the wires 7 can be arranged as below.

Figure 7A:
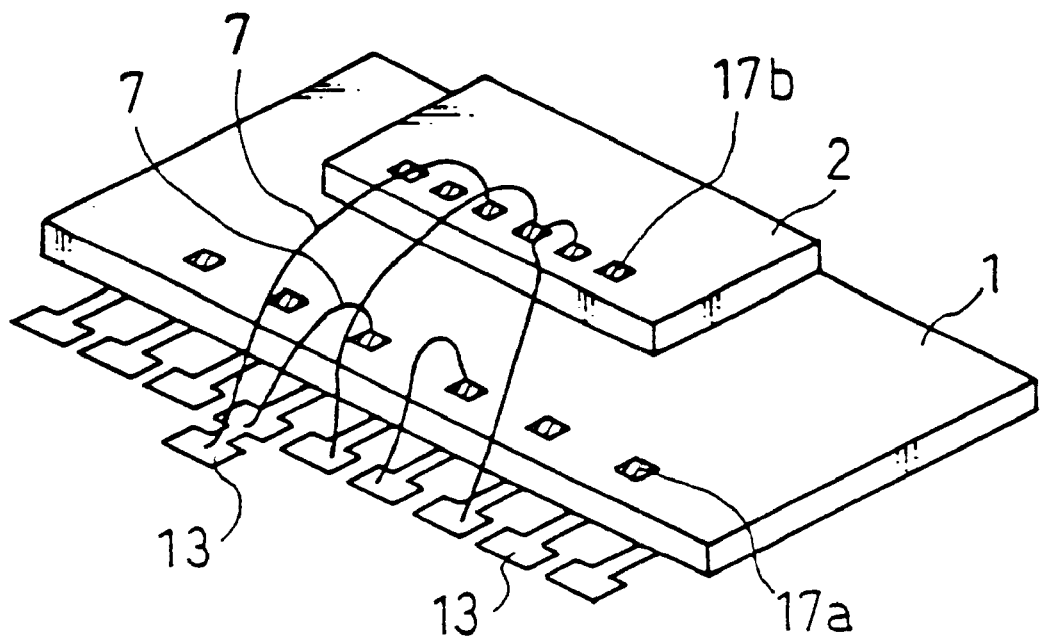
FIG. 7(a) is an explanatory view showing a wiring state when two laminated semiconductor chips are connected to the same electrode section.
Figure 7B:
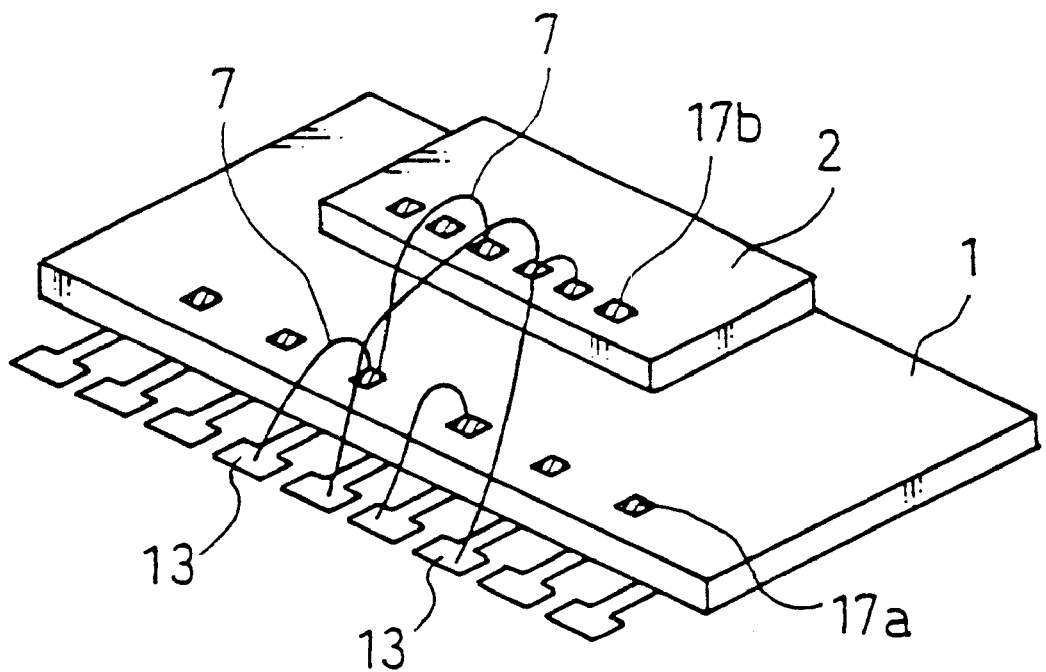
FIG. 7(b) is an explanatory view showing another state that the two laminated semiconductor chips are connected to the same electrode section.

When connecting the first semiconductor chip 1 and the second semiconductor chip 2 to the same electrode section 13 of the wiring layer 4, two arrangements shown in FIGS. 7(a) and 7(b) are acceptable. In the arrangement shown in FIG. 7(a), the electrode section 13 of the wiring layer 4, to which two wires 7 are connected, is arranged to have two parts. In the arrangement shown in FIG. 7(b), an electrode pad 17a of the first semiconductor chip 1 is connected to an electrode pad 17b of the second semiconductor chip 2 with the wire 7, and the electrode pad 17a is connected to the electrode section 13 of the wiring layer 4 with the wire 7, thereby connecting each of the electrode pads 17a and 17b to the electrode section 13.

Figure 8A:
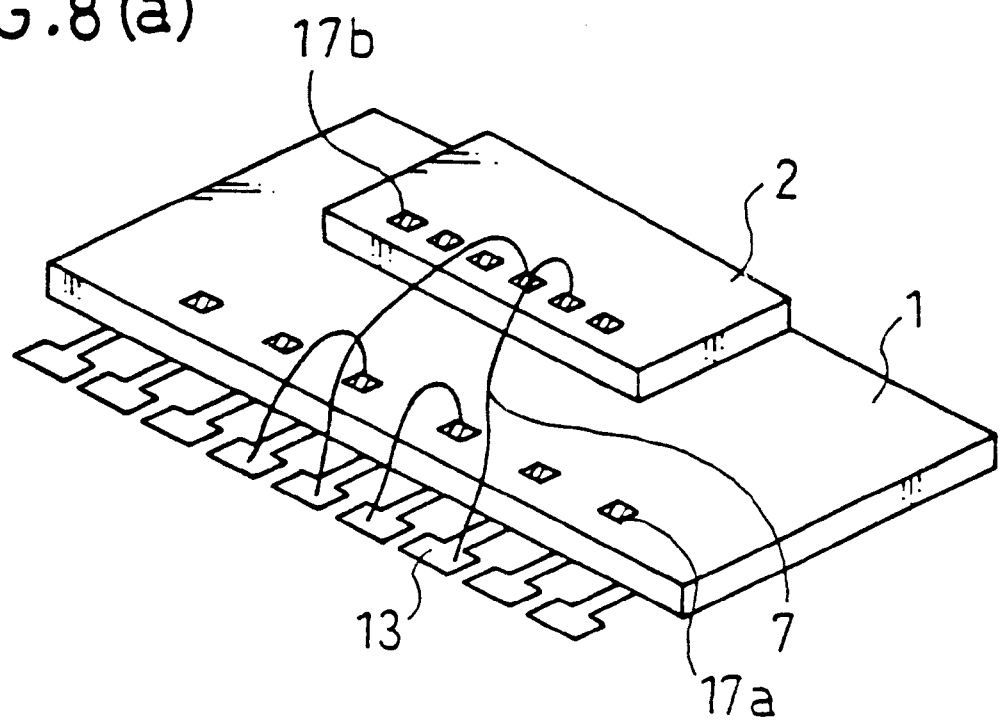
FIG. 8(a) is an explanatory view showing a wiring state that the two laminated semiconductor chips are connected to different electrode sections.
Figure 8B:
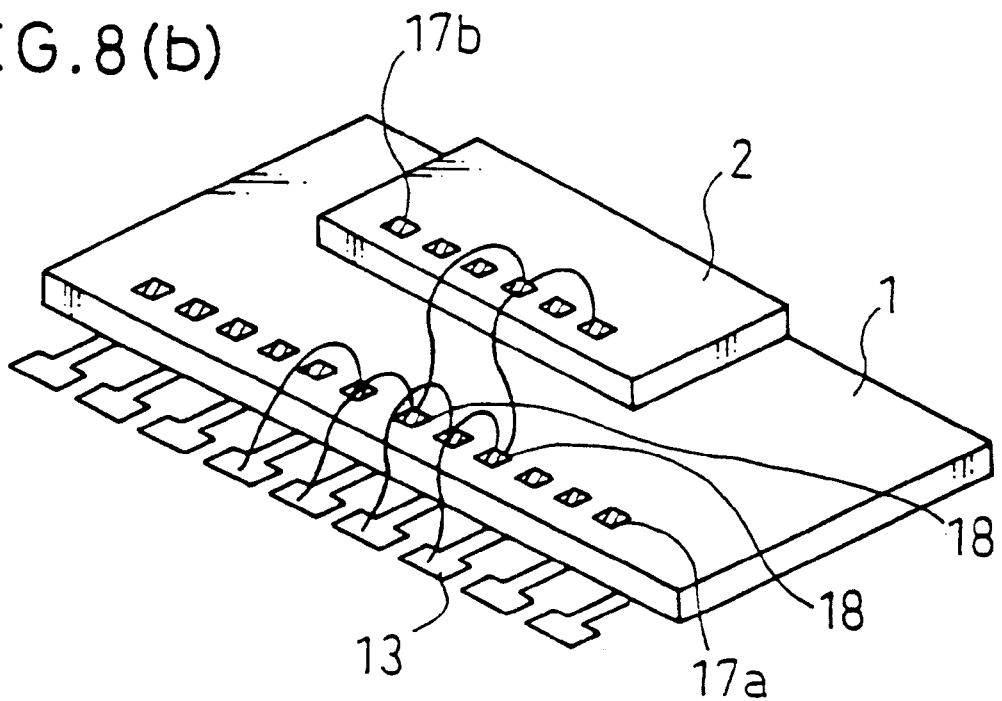
FIG. 8(b) is an explanatory view showing another wiring state that the two laminated semiconductor chips are connected to different electrode sections.

When connecting the first semiconductor chip 1 and the second semiconductor chip 2 to different electrode sections 13 of the wiring layer 4, two arrangements shown in FIGS. 8(a) and 8(b) are acceptable. In the arrangement shown in FIG. 8(a), the electrode pad 17a of the first semiconductor chip 1 and the electrode pad 17b of the second semiconductor chip 2 are each connected directly to the electrode section 13 of the wiring layer 4 with the wire 7. In the arrangement shown in FIG. 8(b), dummy pads 18 are provided on the first semiconductor chip 1, and the electrode pad 17b disposed on the second semiconductor chip 2 is connected to the electrode section 13 of the wiring layer 4 via the dummy pad 18. This arrangement shown in FIG. 8(b) is more preferable because the overhanging part of the wire 7 is shorter than that in the arrangement shown in FIG. 8(a).

Figure 9A:
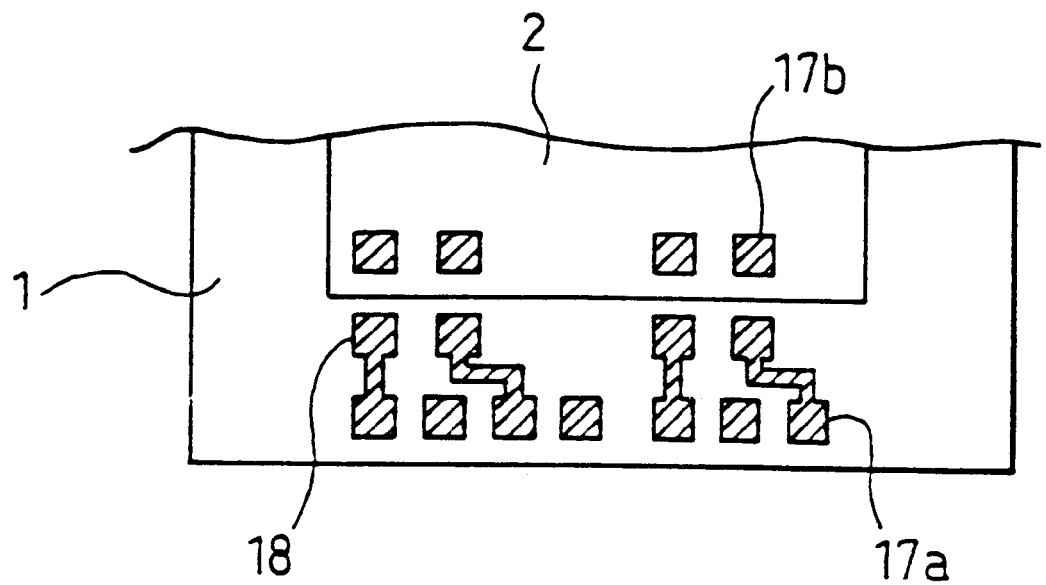
FIG. 9(a) is an explanatory view showing one example of an arrangement of dummy pads formed on a first semiconductor chip.
Figure 9B:
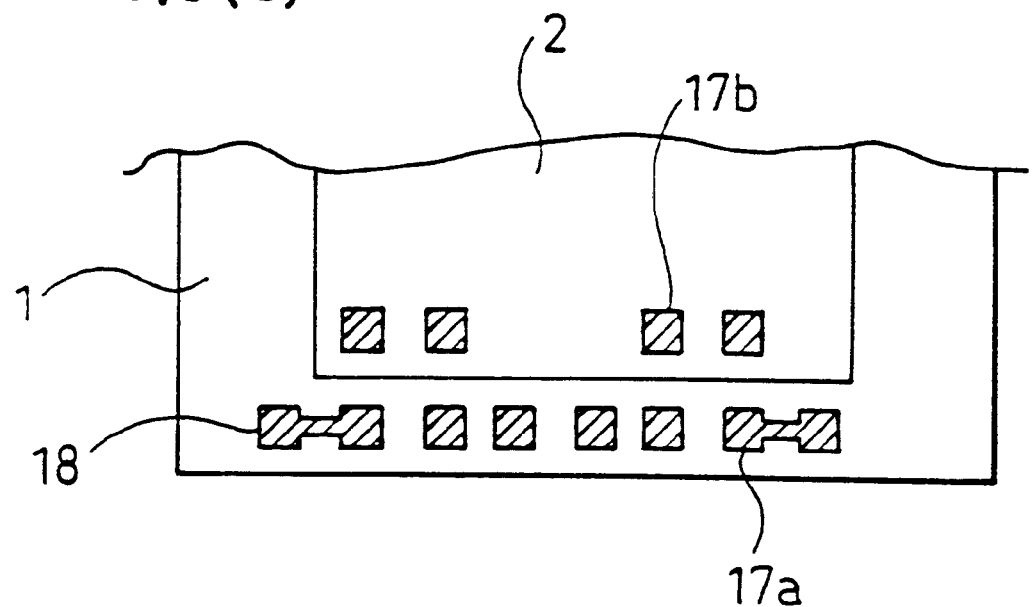
FIG. 9(b) is an explanatory view showing another example of the arrangement of the dummy pads disposed on the first semiconductor chip.

FIGS. 9(a) and 9(b) s how examples of the arrangement of the dummy pads 18 provided on the first semiconductor chip 1.

Embodiment 2

Figure 10:
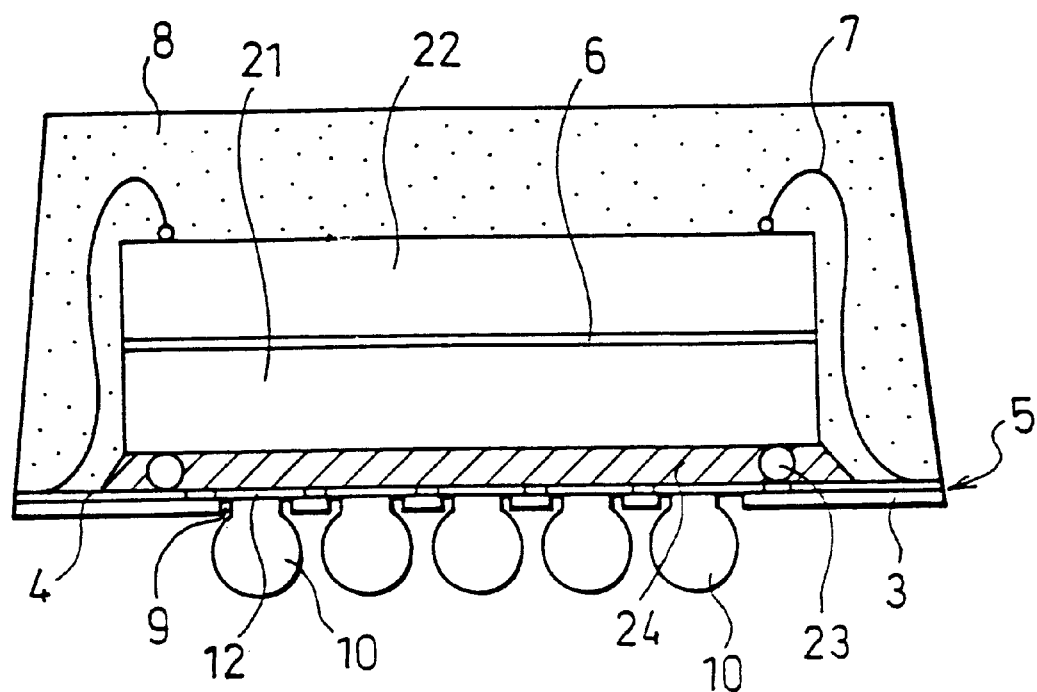
FIG. 10 is a cross-sectional view of a semiconductor device in accordance with the second embodiment of the present invention.
Figure 11A:
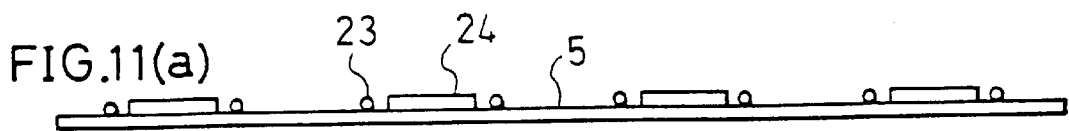
FIGS. 11(a) to 11(g) show one example of a process for manufacturing the semiconductor device.
Figure 11B:
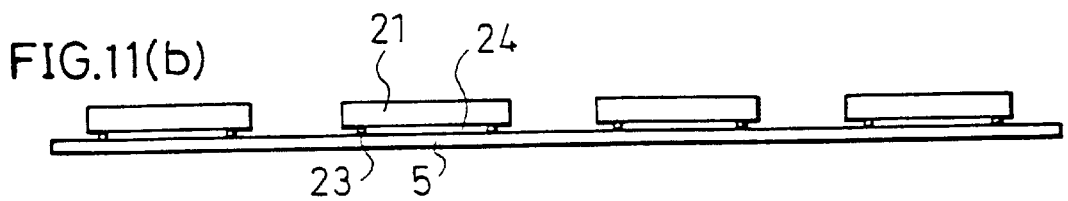
Figure 11C:
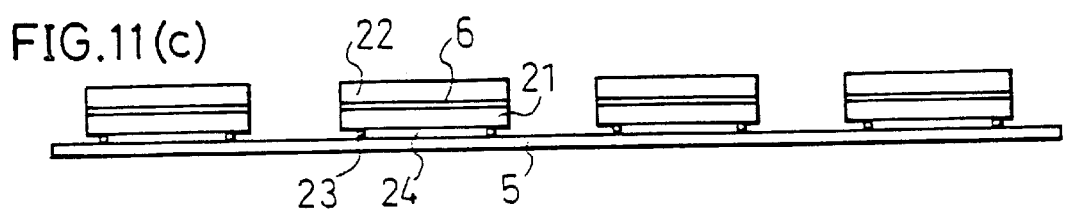
Figure 11D:
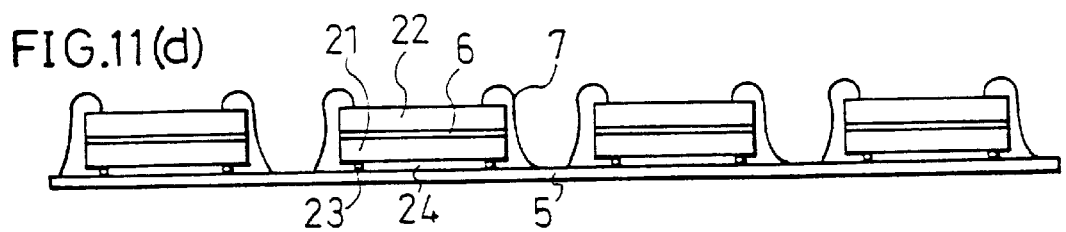
Figure 11E:
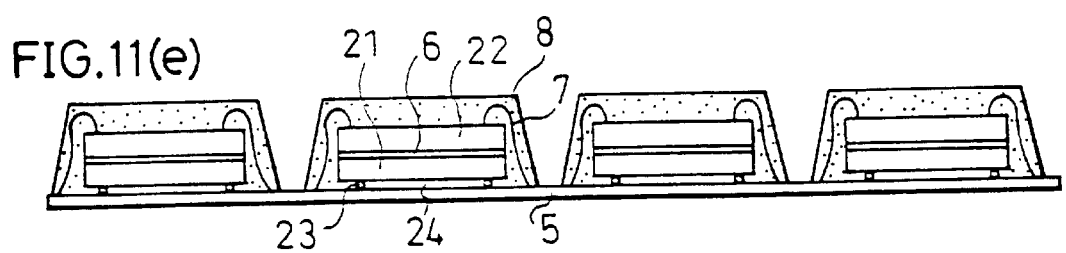
Figure 11F:
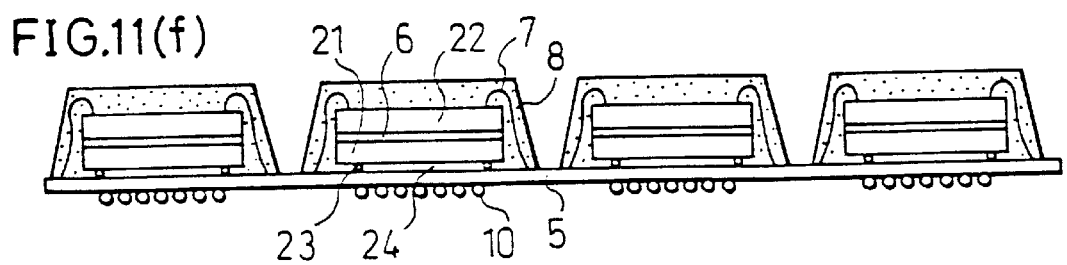
Figure 11G:
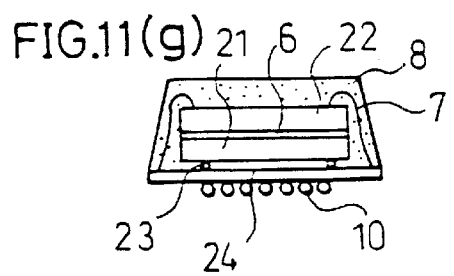
Figure 12A:
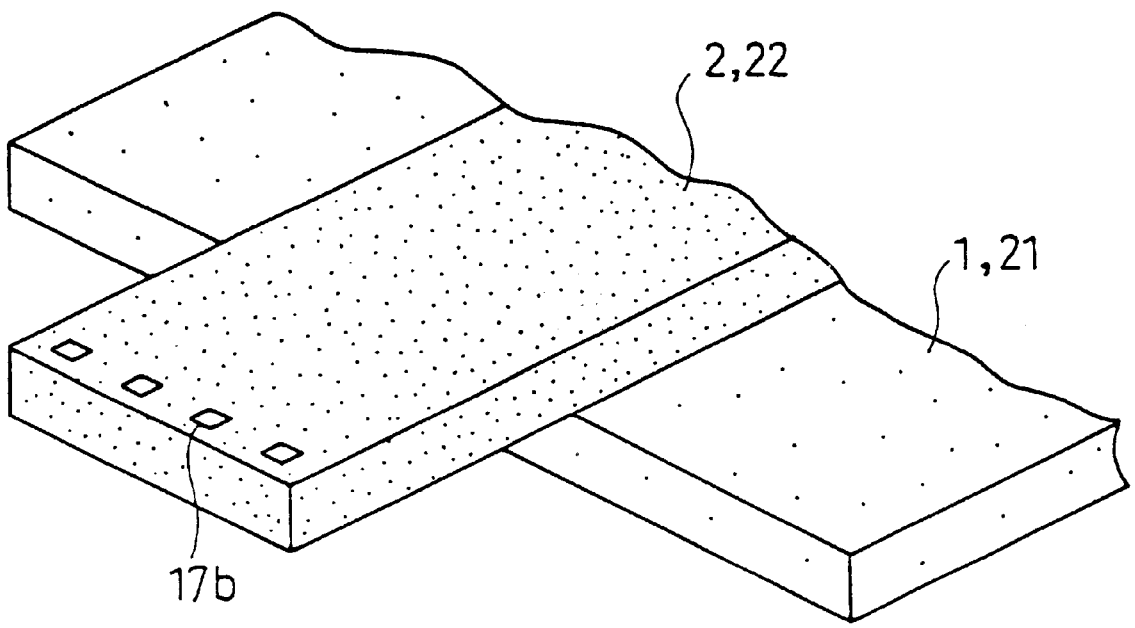
FIG. 12(a) is a perspective view showing that a second semiconductor chip in the semiconductor device in accordance with the first embodiment or the second embodiment protrudes from a first semiconductor chip.
Figure 12B:
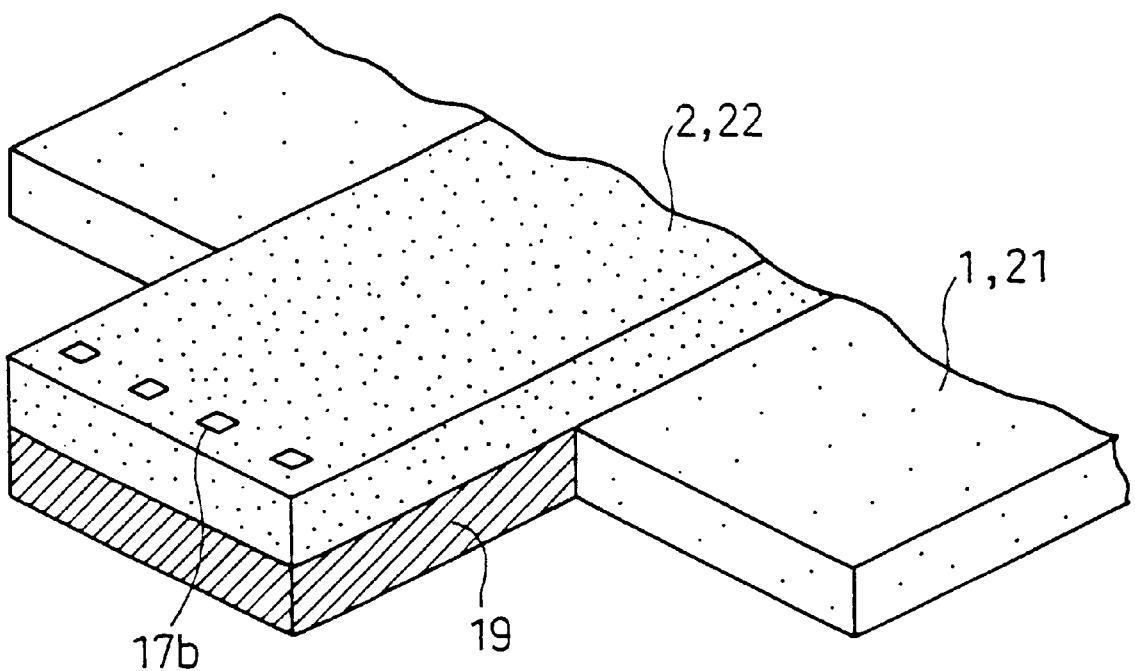
FIG. 12(b) is a perspective view showing that the second semiconductor chip is reinforced.
Figure 13A:
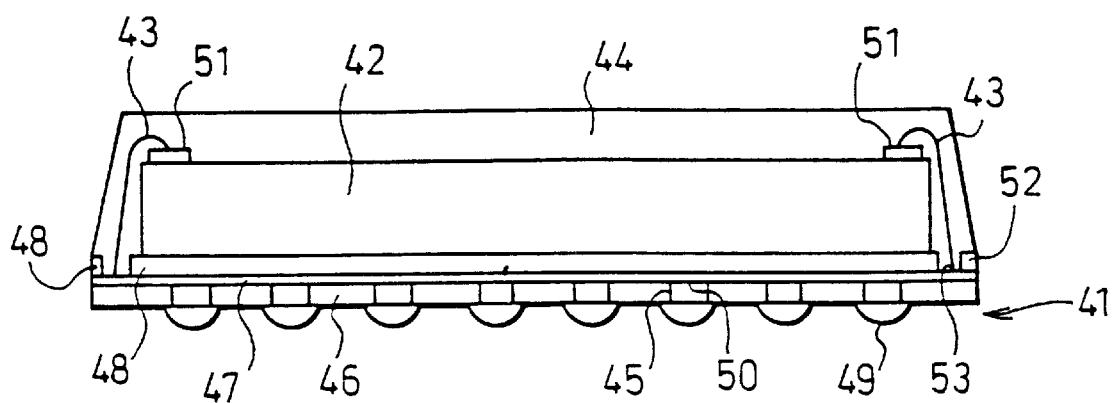
FIG. 13(a) is a cross-sectional view showing a semiconductor device having a CSP structure manufactured by a conventional wire bonding method.
Figure 13B:
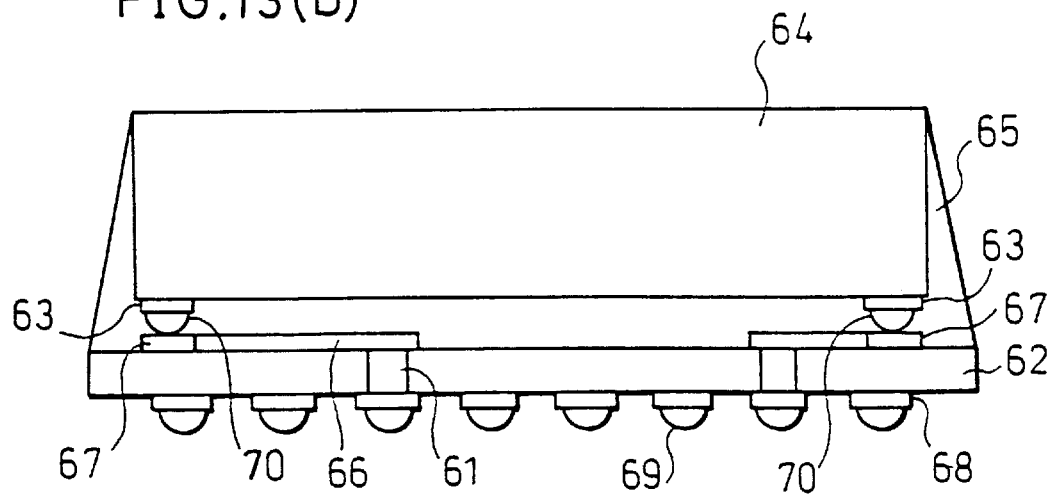
FIG. 13(b) is a cross-sectional view showing a semiconductor device having a CSP structure manufactured by a conventional face-down bonding method.
Figure 14A:
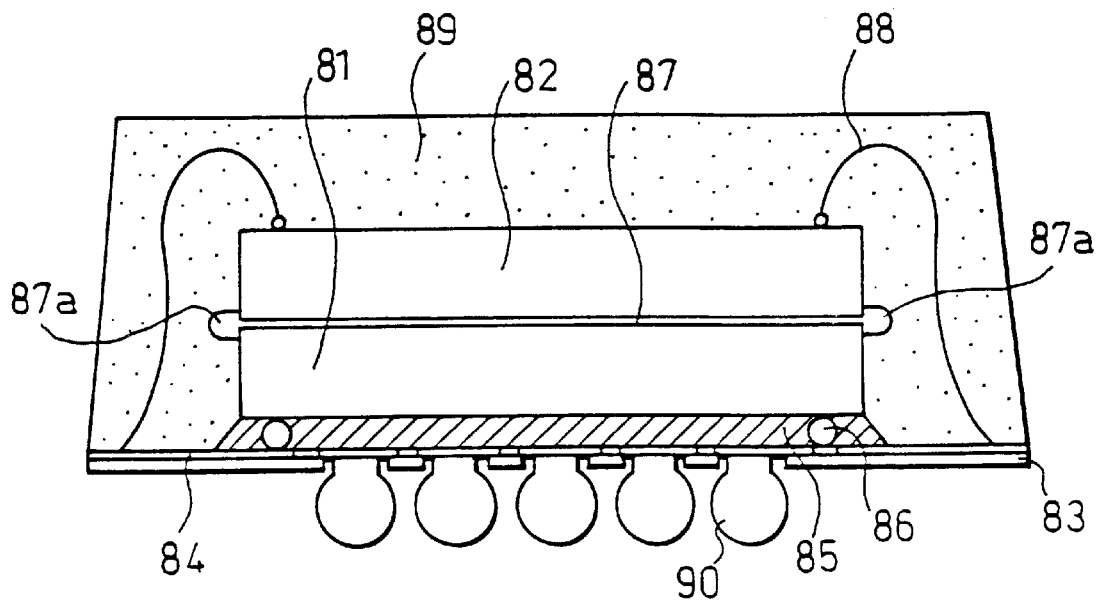
FIG. 14(a) and FIG. 14(b) are cross-sectional views of conventional semiconductor devices having a stacked package structure.
Figure 14B:
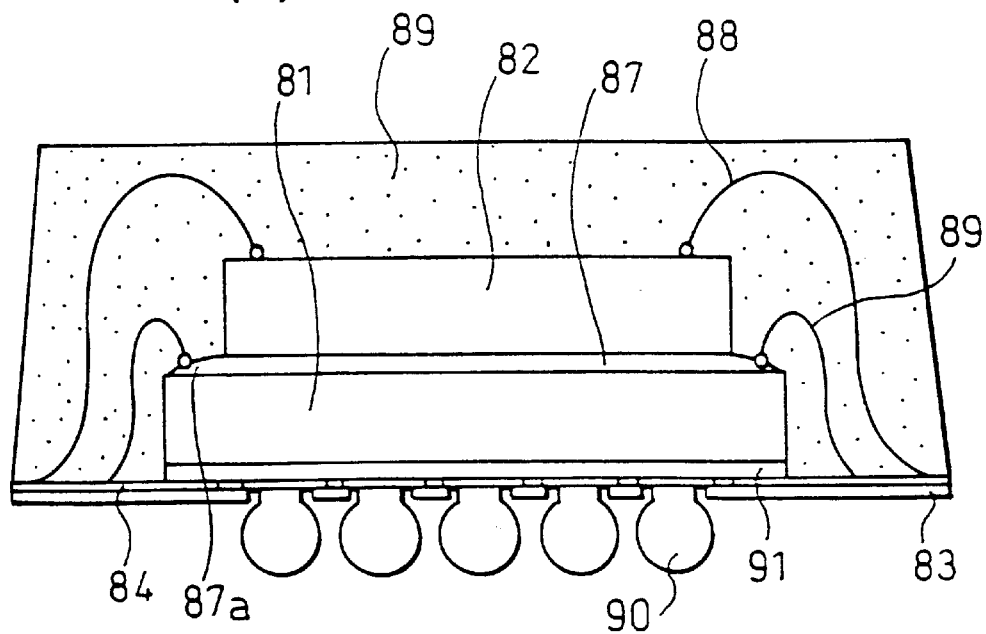
Figure 15:
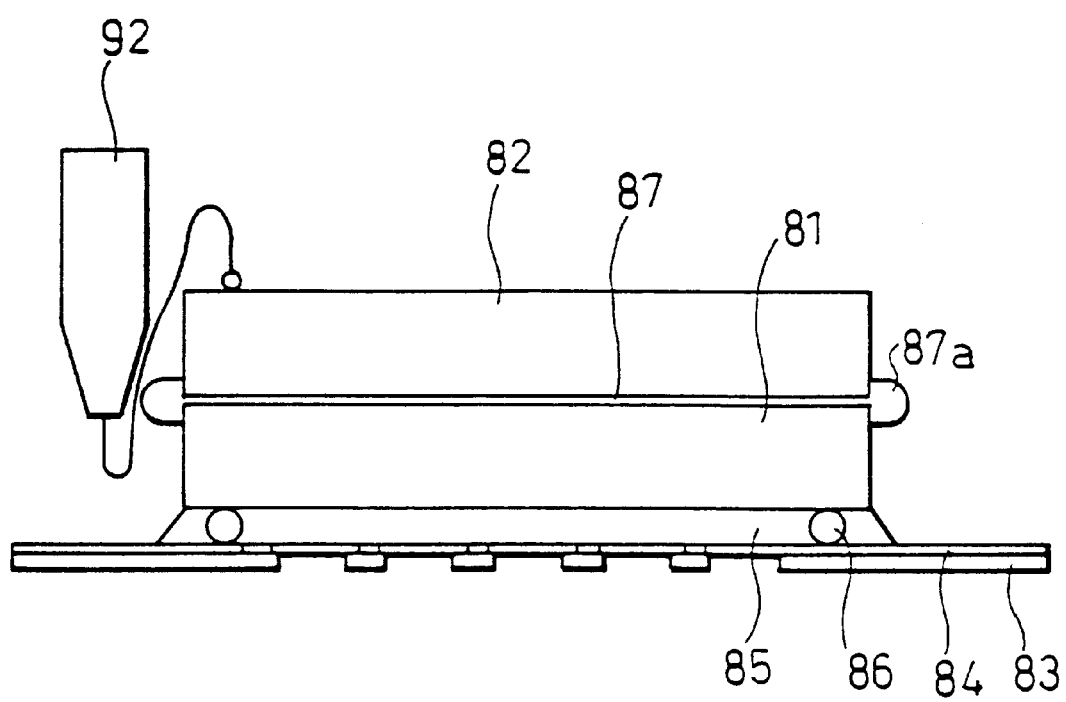
FIG. 15 is a cross-sectional view of the semiconductor device shown in FIG. 14(a) during manufacturing.

With reference to FIGS. 10 to 12, the following descriptions will explain the second embodiment of the present invention. The members having the same structure as those in the above-mentioned first embodiment will be designated by the same reference numbers and their description will be omitted.

A semiconductor device in accordance with the present embodiment is arranged as shown in FIG. 10. Specifically, a first semiconductor chip 21 is mounted on a circuit board 5 with its circuit formed surface facing the circuit board 5, i.e., facing down. The circuit board 5 includes an insulating substrate 3, and a wiring layer 4 formed on the insulating substrate 3. A second semiconductor chip 22 is mounted on the back surface of the first semiconductor chip 21 through a thermo-compression sheet 6. The back surf ace of the second semiconductor chip 22 faces the first semiconductor chip 21. Namely, the back surfaces of the first semiconductor chip 21 and the second semiconductor chip 22 are adhered to each other through the thermo-compression sheet 6. The thermo-compression sheet 6 is provided as an adhesion layer for holding the second semiconductor chip 22 on the first semiconductor chip 21.

The first semiconductor chip 21 is electrically connected to first electrode sections (not shown) provided in the wiring layer 4 through metal bumps 23. The first electrode sections are disposed inside an area of the wiring layer 4, where the first semiconductor chip 21 is mounted.

Meanwhile, the second semiconductor chip 22 is electrically connected to second electrode sections (not shown) provided in the wiring layer 4 with wires 7. Since the second electrode sections are used for wire-bonding the second semiconductor chip 22 to the wiring layer 4, they are disposed outside the area of the wiring layer 4, where the first semiconductor chip 21 and the second semiconductor chip 22 are mounted.

A resin sheet 24 is provided between the first semiconductor chip 21 and the wiring layer 4. The resin sheet 24 is formed by extending a resin sheet used in the step of connecting the first semiconductor chip 21 to the wiring layer 4 through the metal bumps 23.

If electrode pads provided on the circuit formed surface of the first semiconductor chip 21 are made of Al, the metal bumps 23 are preferably made of Au which is easily alloyed with Al. With this arrangement, the metal bumps 23 can be more firmly affixed to the electrode pads.

The material for forming the resin sheet 24 may be a thermoplastic resin or a thermosetting resin. However, the thermoplastic resin is more favorable than the thermosetting resin because the resin sheet 24 is used for the following purpose. Namely, it is used so that the resin extends by heat applied in connecting the first semiconductor chip 21 to the wiring layer 4 with the metal bumps 23, covers the metal bumps 23 as junctions, and prevents degradation of the junctions caused by shock, etc.

The resin sheet 24 can be a three-layer resin sheet including a layer of a light blocking material such as metallic foil. With this arrangement it is possible to prevent a malfunction of the first semiconductor chip 21 due to a light incident from the surface where the packaging-use external terminals 10 are mounted passing through the semiconductor device. In this case, the size of the metallic foil must be such that the metallic foil is out of contact with the metal bumps 23.

Although the semiconductor device in accordance with the present embodiment uses the resin sheet 24, the following arrangement is also acceptable. Namely, the semiconductor chip 21 is mounted without using the resin sheet 24, and then the space produced at a junction of the first semiconductor chip 21 and the wiring layer 4 is filled with a liquid resin, etc., thereby covering the metal bumps 23 as the junctions.

Next, referring to FIGS. 11(a) to 11(g), the following descriptions will explain the process (including steps (1) to (7)) for manufacturing the semiconductor device in accordance with the present embodiment.

(1) First, the resin sheet 24 and the metal bumps 23 are disposed on the circuit board 5 (see FIG. 11(a)). In this case, each of the metal bumps 23 is disposed on the first electrode section provided in the wiring layer 4 on the circuit board 5. The resin sheet 24 is disposed on the circuit board 5 at the location where the first semiconductor chip 21 and the second semiconductor chip 22 are to be mounted.

(2) Next, the first semiconductor chip 21 is connected to the wiring layer 4 on the circuit board 5 by a flip chip method in a face-down mode (see FIG. 11(b)).

(3) Then, the second semiconductor chip 22 is mounted on the back surface of the first semiconductor chip 21 (see FIG. 11(c)). When the second semiconductor chip 22 is in a state of wafer, the insulating thermo-compression sheet 6 is adhered to the back surface of the wafer, and then the wafer is cut to produce chips, i.e., separate pieces of second semiconductor chips 22. The second semiconductor chip 22 is accurately positioned at a specific location on the circuit formed surface of the first semiconductor chip 21.

Like the manufacturing process described in the first embodiment, the process for manufacturing the semiconductor device in accordance with the present embodiment is simplified by adhering the thermo-compression sheet 6 to the back surface of the second semiconductor chip 22 in advance.

(4) Then, the second semiconductor chip 22 is electrically connected to the wiring layer 4 on the circuit board 5 (see FIG. 11(d)). More specifically, each of the electrode pads disposed on the circuit formed surface of the second semiconductor chip 22 is connected to the second electrode section of the wiring layer 4 with the wire 7.

(5) Thereafter, the first semiconductor chip 21, the second semiconductor chip 22, and the wires 7, provided on the circuit board 5, are sealed with a sealing resin 8 (see FIG. 11(e)). The method of forming the sealing resin 8 is similar to that described in the first embodiment.

(6) Then, each of the packaging-use external terminals 10 is disposed at a location of a via hole 9 formed in the insulating substrate 3 of the circuit board 5 (see FIG. 11(f)).

(7) Finally, a plurality of semiconductor devices produced on the circuit board 5 are divided into pieces of semiconductor devices by cutting the insulating substrate 3 along the unnecessary part of the insulating substrate 3 of the circuit board 5, i.e., along the outer edge of the sealing resin 8 of each semiconductor device unnecessary parts (see FIG. 11(d)). The methods of cutting the insulating substrate 3 include a punching method using a die, and an eximer laser method.

In the above-described first embodiment (and in the second embodiment), when mounting the second semiconductor chips 2 (22) on the first semiconductor chips 1 (21), if the first semiconductor chips 1 (21) and the second semiconductor chips 2 (22) have different shapes, the second semiconductor chips 2 (22) may protrude from the first semiconductor chips 1 (21) as shown in FIG. 12(*a*). In this case, since the protruded part of the second semiconductor chip 2 (22) is of low strength, the second semiconductor chip 2 (22) may be possibly destroyed by shock produced when, for example, wire-bonding the electrode pads 17*b* of the second semiconductor chip 2 (22) to the wiring layer 4.

In order to solve the problem, as shown in FIG. 12(*b*), a support member 19 having the same height and the same shape as the first semiconductor device 1 (21) is fixed under the protruded part of the second semiconductor chip 2 (22). By reinforcing the second semiconductor chip 2 (22) with the support member 19, destruction thereof can be prevented. The support member 19 is preferably made of Silicon (Si) in order to reduce generation of stress, etc. against a heat load applied during and after manufacturing the semiconductor device with the CSP structure. In addition, the support member 19 has the same coefficient of linear expansion as the second semiconductor chip 2 (22).

The above-mentioned semiconductor devices in accordance with Embodiments 1 and 2 include two laminated semiconductor chips. However, the present invention can be arranged to include three or more laminated semiconductor chips. In this case, the third semiconductor chip can be mounted on the top of the two semiconductor chips with its circuit formed surface facing up and wire-bonded to the wiring layer 4. Alternatively, the third semiconductor chip can be mounted on the top of the two semiconductor chips with its circuit formed surface facing down through metal bumps by providing electrode pads for disposing the metal bumps on the circuit formed surface of the second semiconductor chip 2 (22).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor device comprising:
   (a) forming a first adhesion layer on a back surface of a first wafer on which no circuit is formed, a circuit being formed on a front surface of the first wafer;
   (b) producing separate first semiconductor chips from said first wafer by dicing;
   (c) mounting said first semiconductor chip on a wiring layer with its back surface facing said wiring layer;
   (d) forming a second adhesion layer on a back surface of a second wafer on which no circuit is formed, a circuit being formed on a front surface of the first wafer;
   (e) producing separate second semiconductor chips from said second wafer by dicing; and
   (f) mounting said second semiconductor chip on said first semiconductor chip with its back surface facing said first semiconductor chip.

2. The method of manufacturing the semiconductor device as set forth in claim 1, further comprising the steps of:
   (g) wire-bonding an electrode section of said first semiconductor chip to an electrode section of said wiring layer with a first wire;
   (h) wire-bonding an electrode section of said second semiconductor chip to an electrode section of said wiring layer with a second wire; and
   (i) sealing said first and second semiconductor chips and said first and second wires,
   said steps (g) to (i) being included after said step(f).

3. The method of manufacturing the semiconductor device as set forth in claim 2, further comprising the steps of:
   (j) forming a metal ball on each end of said second wire;
   (k) connecting one of the metal balls to the electrode section of said second semiconductor chip;
   (l) cutting said second wire; and
   (m) making a surface of the metal ball connected to said second semiconductor chip flat;
   said steps (j) to (m) being included between said steps (g) and (h).

4. The method of manufacturing the semiconductor device as set forth in claim 1, further comprising the steps of:
   (g) wire-bonding an electrode section of said first semiconductor chip to an electrode section of said wiring layer with a first wire;
   (h) forming a metal ball on each end of a second wire;
   (i) connecting one of the metal balls to the electrode section of said second semiconductor chip;
   (j) cutting said second wire;
   (k) wire-bonding an electrode section of said second semiconductor chip to an electrode section of said wiring layer with said second wire; and
   (l) sealing said first and second semiconductor chips and said first and second wires.

5. The method of manufacturing the semiconductor device as set forth in claim 1, further comprising the steps of:
   (g) forming a metal ball on each end of a first wire;
   (h) connecting one of the metal balls to an electrode section of said first semiconductor chip;
   (i) cutting said first wire;
   (j) wire-bonding the electrode section of said first semiconductor chip to an electrode section of said wiring layer with said first wire;
   (k) wire-bonding the electrode section of said first semiconductor chip to an electrode section of said second semiconductor chip with a second wire;
   (l) sealing said first and second semiconductor chips and said first and second wires.

6. The method of manufacturing the semiconductor device as set forth in claim 1, further comprising the steps of:
   (g) forming a metal ball on each end of a first wire;
   (h) connecting one of the metal balls to a dummy pad providing on said first semiconductor chip;
   (i) cutting said first wire;
   (j) wire-bonding the dummy pad of said first semiconductor chip to an electrode section of said wiring layer with said first wire;
   (k) wire-bonding the dummy pad of said first semiconductor chip to an electrode section of said second semiconductor chip with a second wire; and
   (l) sealing said first and second semiconductor chips and said first and second wires.

7. A method of manufacturing a semiconductor device comprising:
   (a) forming an insulating layer and a metal bump on a wiring layer;

(b) mounting a first semiconductor chip on said wiring layer with its circuit-formed surface facing said wiring layer;

(c) forming an adhesion layer on a back surface of a wafer on which no circuit is formed, whereby a circuit is formed on a front surface of the wafer;

(d) producing separate second semiconductor chips from the wafer by dicing;

(e) mounting said second semiconductor chip on said first semiconductor chip with the back surface of the second semiconductor chip facing said first semiconductor chip;

(f) wire-bonding an electrode section of said second semiconductor chip to an electrode section of said wiring layer with a wire; and (g) sealing said first and second semiconductor chips and said wire.

8. The method of manufacturing the semiconductor device as set forth in claim 7, further comprising the steps of:

(h) forming a metal ball on each of said wire;

(i) connecting one of the metal balls to the electrode section of said second semiconductor chip;

(j) cutting said wire; and (k) making a surface of the metal ball connected to said second semiconductor chip flat;

said steps (h) to (k) being including between said steps (e) and (f).

9. The method of manufacturing the semiconductor device as set forth in claim 7, further comprising the steps of:

(h) forming a metal ball on each of said wire;

(i) connecting one of the metal balls to the electrode section of said second semiconductor chip; and (j) cutting said wire;

said steps (h) to (j) being including between said steps (e) and (f).

10. A method of manufacturing a semiconductor device comprising:

(a) applying an adhesive paste on a wiring layer, and thereafter, mounting a first semiconductor chip on said wiring layer with a back surface of said semiconductor chip facing said wiring layer, the back surface having no circuit formed thereon;

(b) forming an adhesion layer on a back surface of a wafer on which no circuit is formed, whereby a circuit is formed on a front surface of the wafer;

(c) producing separate second semiconductor chips from the wafer by dicing; and (d) mounting said second semiconductor chip on said first semiconductor chip with the back surface of the second semiconductor chip facing said first semiconductor chip.

11. The method of manufacturing the semiconductor device as set forth in claim 10, further comprising the steps of:

(e) wire-bonding an electrode section of said first semiconductor chip to an electrode section of said wiring layer with a first wire;

(f) wire-bonding an electrode section of said second semiconductor chip to an electrode section of said wiring layer with a second wire; and (g) sealing said first and second semiconductor chips and said wires, said steps (e) to (g) being included after said step (d).

12. The method of manufacturing the semiconductor device as set forth in claim 10, further comprising the steps of:

(e) wire-bonding an electrode section of said first semiconductor chip to an electrode section of said wiring layer with a first wire;

(f) forming a metal ball on each end of a second wire;

(g) connecting one of the metal balls to the electrode section of said second semiconductor chip; and (h) cutting said second wire;

(i) wire-bonding an electrode section of said wiring layer to the electrode section of said second semiconductor chip with said second wire;

(j) sealing said first and second semiconductor chips and said first and second wires, said steps (e) to (j) being included after said step (d).

13. The method of manufacturing the semiconductor device as set forth in claim 10, further comprising the steps of:

(e) forming a metal ball on each end of a first wire;

(f) connecting one of the metal balls to the electrode section of said first semiconductor chip; and (g) cutting said first wire;

(h) wire-bonding an electrode section of said wiring layer to the electrode section of said first semiconductor chip with said first wire;

(i) wire-bonding the electrode section of said first semiconductor chip to an electrode section of said second semiconductor chip with a second wire;

(j) sealing said first and second semiconductor chips and said first and second wires, said steps (e) to (j) being included after said step (d).

14. The method of manufacturing the semiconductor device as set forth in claim 10, further comprising the steps of:

(e) forming a metal ball on each end of a first wire;

(f) connecting one of the metal balls to a dummy pad providing on said first semiconductor chip;

(g) cutting said first wire;

(h) wire-bonding the dummy pad of said first semiconductor chip to an electrode section of said wiring layer with said first wire;

(i) wire-bonding the dummy pad of said first semiconductor chip to an electrode section of said second semiconductor chip with a second wire; and (j) sealing said first and second semiconductor chips and said first and second wires, said steps (e) to (j) being included after said step (d).

15. A method of manufacturing a semiconductor device comprising:

(a) forming a first adhesion layer on a back surface of a first wafer, no circuit being formed on the back surface of the first wafer;

(b) producing separate first semiconductor chips from said first wafer by dicing;

(c) mounting at least one of said first semiconductor chips on a wiring layer with the back surface of the at least one first semiconductor chip facing said wiring layer;

(d) forming a second adhesion layer on a back surface of a second wafer, no circuit being formed on the back surface of the second wafer;

(e) producing separate second semiconductor chips from said second wafer by dicing; and (f) mounting at least one of said second semiconductor chips on said at least one of said first semiconductor chip with the back surface of the at least one second semiconductor chip facing said at least one of said first semiconductor chips.

* * * * *